United States Patent [19]

Kakehashi

[11] 4,164,884

[45] Aug. 21, 1979

[54] DEVICE FOR PRODUCING A CHORUS EFFECT

[75] Inventor: Ikutaro Kakehashi, Osaka, Japan

[73] Assignee: Roland Corporation, Japan

[21] Appl. No.: 874,320

[22] Filed: Feb. 1, 1978

Related U.S. Application Data

[63] Continuation of Ser. No. 698,147, Jun. 21, 1976, abandoned.

[30] Foreign Application Priority Data

Jun. 24, 1975 [JP] Japan .................................. 50/79153

Apr. 6, 1976 [JP] Japan .................................. 51/38914

[51] Int. Cl.2 .......................... G10H 1/04; H03H 7/30

[52] U.S. Cl. ...................................... 84/1.24; 84/1.25; 84/DIG. 4; 179/1 J; 179/1 P; 332/16 R; 333/150

[58] Field of Search ...................... 84/1.22, 1.24, 1.25, 84/DIG. 4, DIG. 26; 179/1 J, 1 M, 1 P, 1 SS; 332/16 R; 333/29

[56] References Cited

U.S. PATENT DOCUMENTS

| | | | |
|---|---|---|---|
| 3,749,837 | 7/1973 | Doughty | 179/1 J |
| 3,833,752 | 9/1974 | Van Der Kooij | 84/1.24 |
| 3,866,505 | 2/1975 | Adachi | 84/1.24 |
| 3,920,905 | 11/1975 | Sharp | 179/1 J |
| 4,000,676 | 1/1977 | Love | 84/1.25 |
| 4,005,268 | 1/1977 | Canell et al. | 179/1 J |

OTHER PUBLICATIONS

Alley and Attwood, Electronic Engineering, Second Edition, ©1962, 1966 by John Wiley and Sons, Inc., Library of Congress Catalog Card No. 66-16128, pp. 564-565.

*Primary Examiner*—Stanley J. Witkowski

*Attorney, Agent, or Firm*—Wenderoth, Lind & Ponack

[57] ABSTRACT

A device for producing a chorus effect in an electronic musical instrument. An electronic delay circuit and a non-modulating amplifier means are coupled in parallel and the outputs are mixed in a mixing amplifier. A carrier oscillator is coupled to the delay circuit for controlling the time delay of the delay circuit according to the frequency of its output, and normally oscillates at a relatively high frequency in the range of 80-100 KHz. A modulation signal generator is coupled to the carrier oscillator for frequency modulating the carrier oscillator toward lower oscillating frequencies, and a control signal generator is coupled between the input to the delay circuit and the modulation signal generator for detecting the musical tone signal input to the delay circuit and producing a control signal only when a musical tone signal input is detected. The delay time of the electronic delay circuit is thus modulated only when a musical tone signal input exists and when the carrier oscillator is not subjected to frequency modulation when no musical tone signal exists, the noise in the delay circuit is not modulated and any jarring effect in the output thereof is substantially eliminated.

6 Claims, 18 Drawing Figures

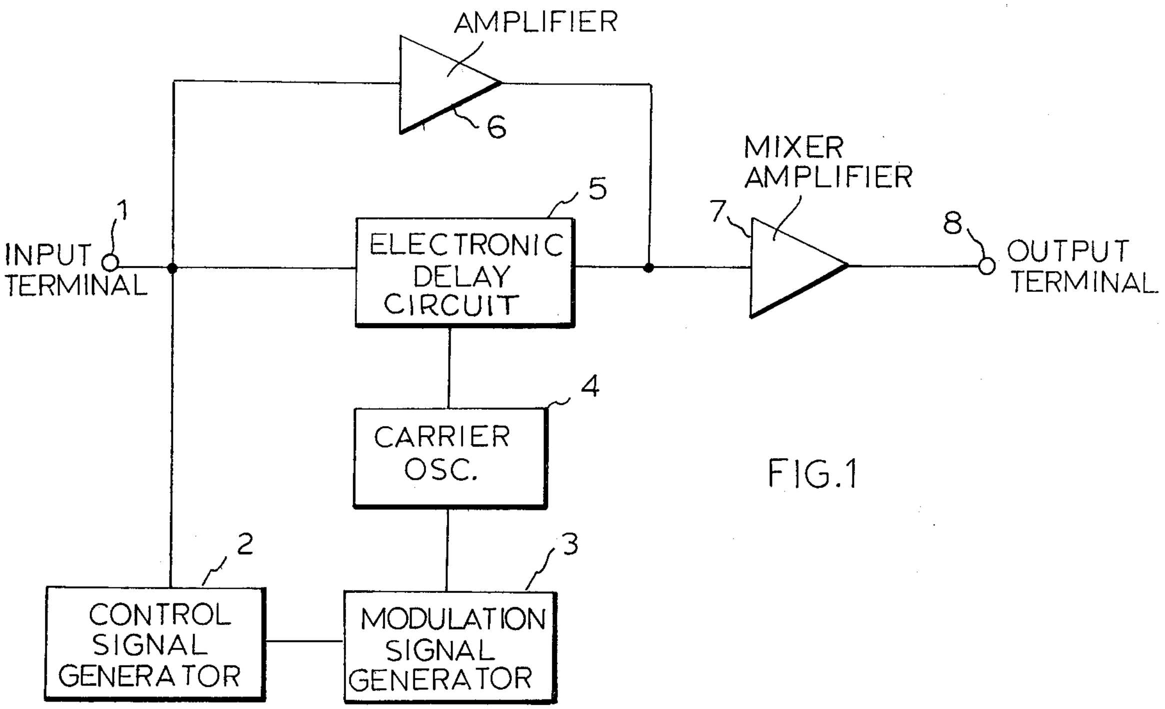
FIG.1
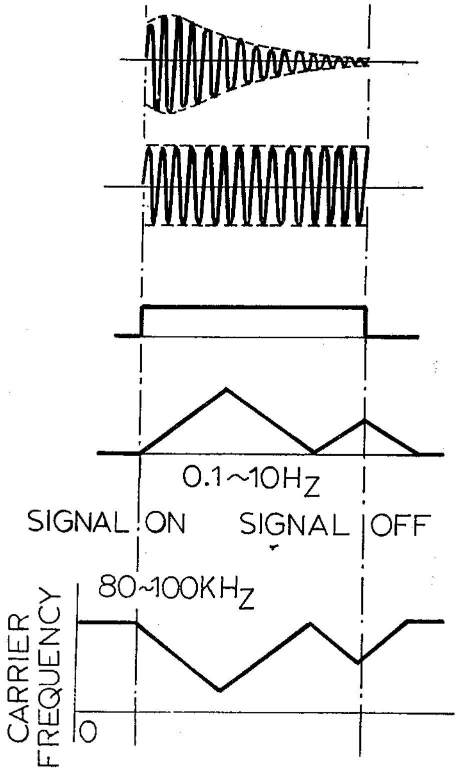
FIG. 2 (1)
FIG. 2 (1)′
FIG. 2 (2)
FIG. 2 (3)
FIG. 2 (4)

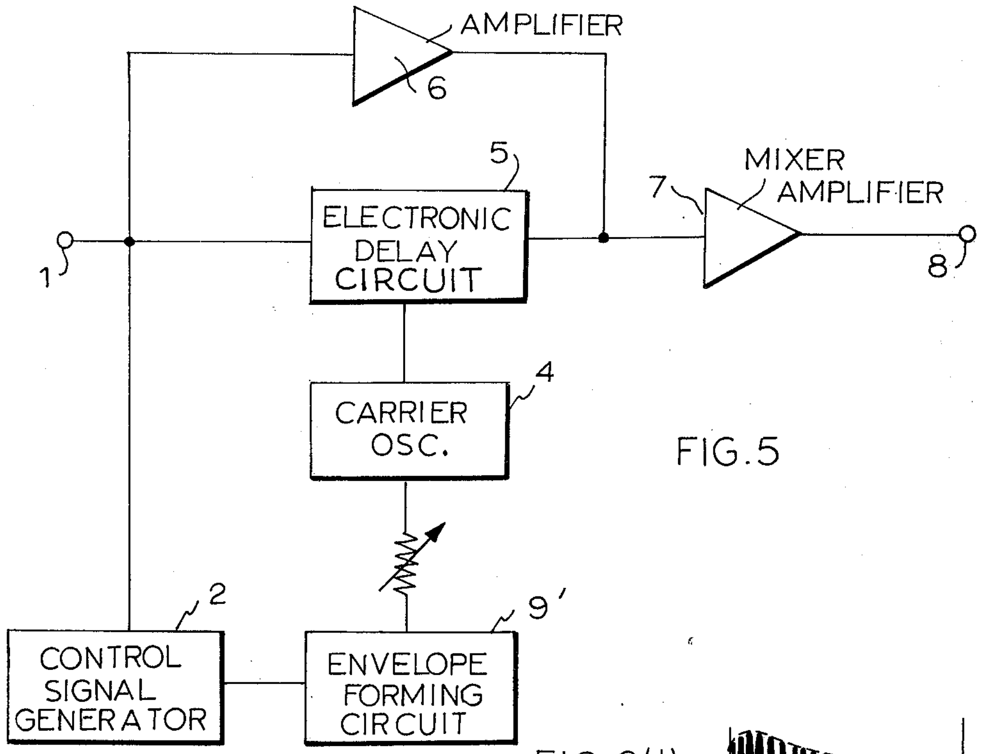
FIG.5
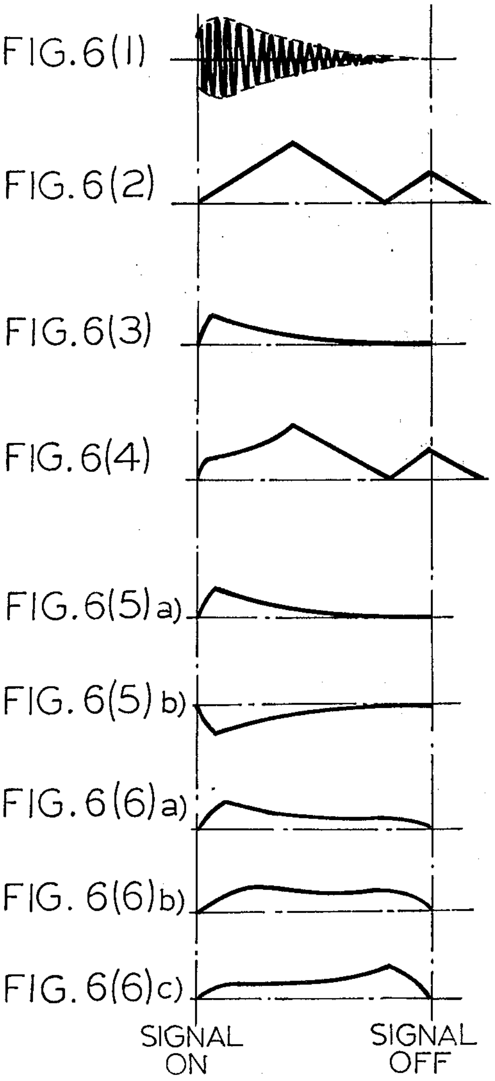
FIG.6(1)
FIG.6(2)
FIG.6(3)
FIG.6(4)
FIG.6(5)a)
FIG.6(5)b)
FIG.6(6)a)
FIG.6(6)b)
FIG.6(6)c)

DEVICE FOR PRODUCING A CHORUS EFFECT

This is a continuation of application Ser. No. 698,147, filed June 21, 1976, and now abandoned.

This invention relates to a device for producing a chorus effect in an electronic musical instrument, and more particularly to a device which eliminates the jarring effect produced by prior art devices for achieving a chorus effect.

BACKGROUND OF THE INVENTION AND PRIOR ART

There have been various devices proposed for producing a chorus effect in an electronic musical instrument, wherein the effect has been achieved by mixing a plurality of musical tone signals in which a slight difference of pitch has been caused to be present between each pair of adjacent signals. One type of such device does this by modulating the delay time of one or more musical tone signals.

In one prior art device for producing a chorus effect, wherein the delay time of the original musical tone signal is modulated by means of an electronic delay element as a bucket brigade device, and the modulated musical tone signal is mixed with the original non-modulated musical tone signal to produce a chorus effect, noise existing in the delay circuit, although it may be extremely small, often causes a jarring effect on the listener if it is modulated by a lower frequency wave so as to change the tone of the noise.

OBJECTS AND BRIEF SUMMARY OF THE INVENTION

It is the object of this invention to provide a device for achieving a chorus effect, wherein the defects described above are eliminated and to adequately achieve such an effect without the jarring effect of noise by means of a simply constructed circuit.

A further object is to provide a device which will also produce a delicate frequency variation to produce tone variations which will enhance the quality of the musical tone considerably.

These objects are achieved by a device for producing a chorus effect in an electronic musical instrument comprising an electronic delay circuit, non-modulating amplifier means coupled in parallel with said electronic delay circuit, mixing amplifier means coupled to the outputs of said delay circuit and said non-modulating amplifier means for mixing the outputs thereof, a carrier oscillator coupled to said delay circuit for controlling the time delay of said circuit according to the frequency of its output and normally oscillating at a relatively high frequency, and modulation signal generating means coupled to said carrier oscillator for frequency modulating said carrier oscillator toward lower oscillating frequencies. The modulation signal generating means can include a control signal generator coupled between the input to said delay circuit and a modulation signal generator for detecting the musical tone signal input to said delay circuit and producing a control signal only when a musical tone signal input is detected. By this device, the delay time of said electronic delay circuit is modulated only when a musical tone signal input exists and when the carrier oscillator is not subjected to frequency modulation when no musical tone signal exists, the noise in said delay circuit is not modulated and any jarring effect in the output thereof is substantially eliminated.

The modulating signal generating means can include an envelope follower coupled in parallel with the modulating signal generator and the control signal generator, or can be an envelope follower and a phase inverter connected in series, or can be a control signal generator and an envelope forming circuit connected in series.

BRIEF DESCRIPTION OF THE DRAWINGS

The device according to this invention will now be described in detail with reference to the accompanying drawings, in which:

FIG. 1 is a schematic circuit diagram of an embodiment of the device for producing a chorus effect according to this invention;

FIGS. 2(1)–2(4) are waveforms of various signals in the circuit of FIG. 1;

FIGS. 3, 4 and 5 are schematic circuit diagrams of modified embodiments of the musical tone modulation circuit of this invention, respectively; and FIGS. 6(1) to **6(6*c*) are waveforms of various signals in the embodiments of FIGS. 3–5**.

DETAILED DESCRIPTION OF THE INVENTION

Figure 3:
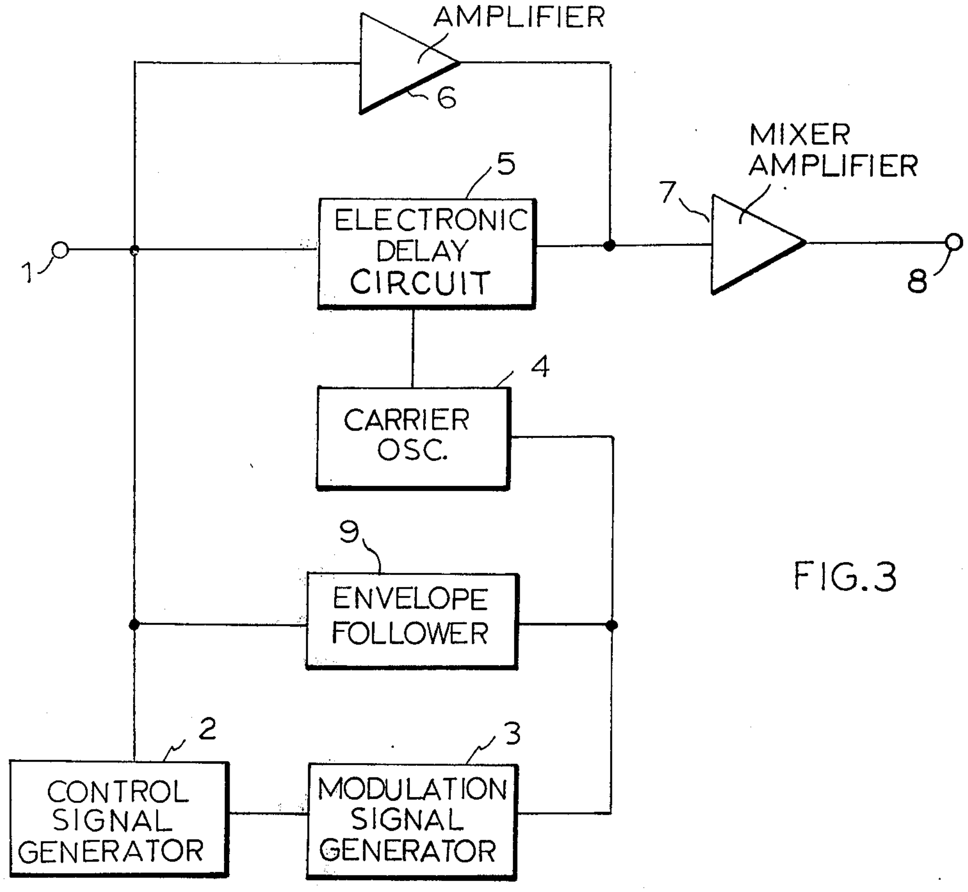

The original musical tone signal as shown in FIG. 2(1) or 2(1') is supplied from input terminal 1 to an electronic delay circuit, such as a bucket brigade device, to which a carrier oscillator 4 is connected so as to control the delay circuit 5. The delay produced by electronic delay circuit 5 is controlled by the frequency of carrier oscillator 4. The higher the frequency of the carrier oscillator 4, the shorter the delay and vice versa. The original musical tone signal is also amplified in an amplifier 6 connected in parallel with delay circuit 5. The original musical tone signal is also supplied from an input terminal 1 to a modulating signal generating means for modulating the carrier oscillator 4. This means is constituted by a control signal generator 2 to produce a gate signal as shown in FIG. 2(2), which is generated only while an input signal exists, and a signal generator 3 to which the output of gate signal generator 2 is coupled and which is driven, while the gate signal is applied thereto to generate a low frequency modulating signal with a frequency in the range of 0.1–10 Hz, as shown in FIG. 2(3). This signal is supplied to frequency modulate the carrier signal produced by the carrier oscillator 4. FIG. 2(3) shows the modulating signal as having a triangular waveform, but such a signal can have a sinusoidal or sawtooth waveform as generated by signal generator 3.

Because of the fact that the carrier oscillator 4 is subjected to a frequency modulation only while the input signal exists and the delay time of the electronic delay circuit 5 will be modulated only while the energy of the original musical tone signal from the input terminal 1 exists and the frequency modulation of the carrier oscillator 4 will be carried out only while a musical tone signal is being generated, so that noise existing in the delay circuit while no musical tone signal is being generated will not be modulated while no music is played, the tone of the noise will not be varied, and accordingly noise existing in the delay circuit will not produce any jarring effect.

Basically speaking, when the musical tone signal passes through the delay circuit 5, the musical tone signal has a sufficiently higher level than the noise existing in the delay circuit so that any change in the musical tone signal due to the noise will not be sensed by human ears. On the other hand, while a musical tone signal is not passing through the delay circuit, i.e. when no music is being played, noise whose time delay is controlled by the varying frequency of the carrier oscillator signal produced by the carrier oscillator 4 can be heard and may produce a jarring effect. Accordingly, the problem of the jarring effect can be solved by this invention, wherein means are provided to block the carrier frequency from being modulated while no music is being played. Not only is the device of the present invention useful to produce a modulation signal while the musical tone signal exists, as described above, but means for making the modulation signal continue for a predetermined interval after the musical tone signal ceases would also be useful, for example for an electronic guitar, wherein a sustained musical tone signal is employed.

The delay produced by delay circuit 5 is determined by the frequency of carrier oscillator 4. The frequency of the carrier oscillator 4 is important in the present invention. The frequency of the carrier oscillator generally used for an electronic delay element is from about 15KHz to 100KHz, and it has been found that the higher the carrier frequency, the less the noise which originates from the delay element. Accordingly, if the carrier frequency is set at a high frequency when no musical tone signal is supplied, and the carrier frequency is shifted towards a lower frequency in accordance with the depth of modulation when frequency modulation is performed by a modulation signal, then a much better decrease of the noise effect can be obtained.

Accordingly, the carrier oscillator 4 in the device for producing a chorus effect according to this invention develops a predetermined range of oscillation frequencies from 80KHz to 100KHz when no musical tone signal exists at input terminal 1, so that the carrier frequency is adapted to be modulated only towards lower frequencies, depending on the magnitude of the musical tone signal input only while the modulation signal generator 3 is generating a modulation signal while the musical tone signal input exists. A graph of the frequencies of the thus modulated tone signal is shown in FIG. 2(4). Consequently, if no musical tone signal exists, the noise from the electronic delay circuit 5 will also be very slight, as described above.

As described above, the original musical tone signal coming through the amplifier 6 without being time delay modulated therein and the modulated musical tone signal having been modulated in the above-described electronic delaying dircuit 5 are mixed in the mixer amplifier 7, the output terminal 8 of which will deliver a musical tone signal output having a chorus effect, wherein substantially no noise effect can be sensed.

As may be seen from the above description, in the device for producing a chorus effect according to this invention, the delay time modulation necessary for attaining the chorus effect is carried out only while a musical tone is being played, but no delay time modulation is carried out while no musical tone is being played, and therefore, any jarring noise such as would be created by the change of tone due to the noise existing in the delay circuit being time delay modulated will not be sensed, so that an adequate chorus effect substantially free from distortions due to modulated noise can be achieved.

The circuit of FIG. 1 can be modified to produce delicate frequency variations to enhance the quality of the output terminal 8.

The first such modification is shown in FIG. 3, in which the modulating signal generating means further includes an envelope follower, and the output envelope signal of the envelope follower 9 is superposed on the modulating signal from the modulation signal generator 3, which is adapted to frequency-modulate the frequency of the carrier oscillator signal of the carrier oscillator 4 by connecting the envelope follower in parallel with the control signal generator 2 and the modulation signal generator 3. FIG. 6(1) shows the waveforms of the input musical tone signal and FIG. 6(2) shows the output modulation signal of the modulation signal generator 3. FIG. 6(3) shows the output envelope signal of the envelope follower 9. In the circuit of FIG. 3, the modulation signal of FIG. 6(2) and the envelope signal of FIG. 6(3) are superposed as described above to produce a modulation signal as shown in FIG. 6(4) which is applied to the carrier oscillator 4, so that the delay time of the electronic delay circuit 5 will be modulated by the waveform of FIG. 6(4). Thus, in the mixer 7, the original musical tone signal coming from the amplifier 6 without being modulated and the modulated musical tone signal coming through the electronic delay circuit 5 after having been time delay modulated therein will be mixed, resulting in an output musical tone signal at the output terminal 8 which has a chorus effect including a tone variation in the initial frequency varying period of the musical tone signal.

Figure 4:
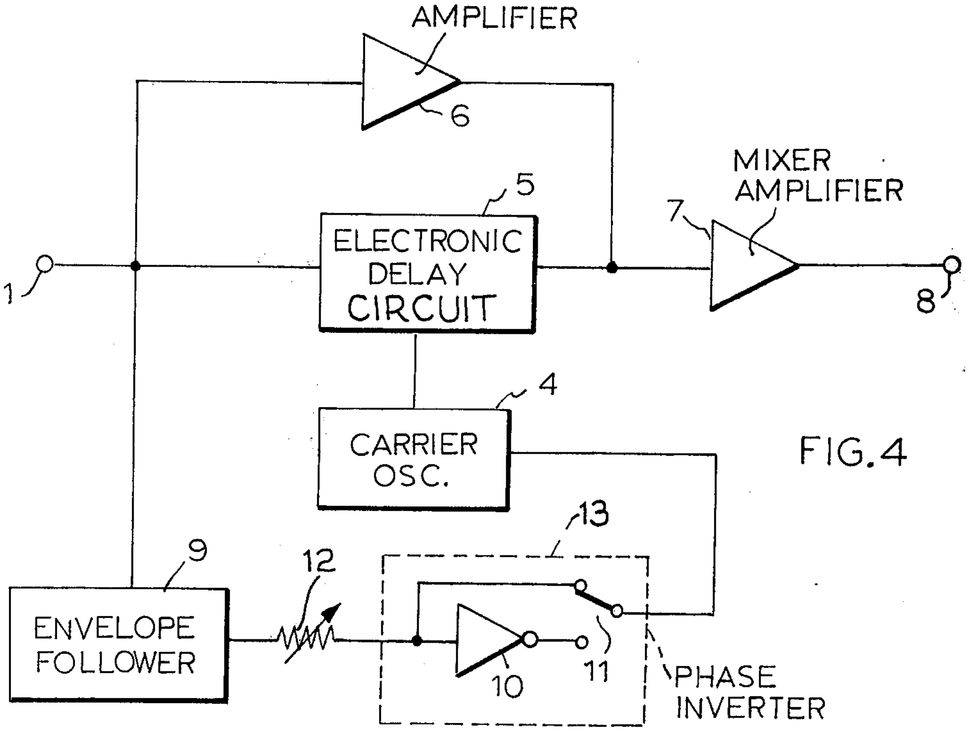

The second modification is shown in FIG. 4, in which the modulating signal generating means is constituted by an envelope follower 9 connected in series with a selective phase inversion circuit 13 which consists of a phase inverter 10 and a changeover switch 11. Selective phase inversion circuit 13 enables selection of the normal or inverted phase signal from the envelope follower 9. The output envelope signal of the envelope follower 9 is employed as the modulation signal for the frequency of the carrier oscillator signal of the carrier oscillator 4, and the phase of the above-said envelope signal can be inverted by selective phase inversion circuit 13, if desired. Variable resistor 12 is provided to adjust the crest value of the envelope signal to control the depth of the frequency modulation of the carrier oscillator signal of the carrier oscillator 4, and thus the range of delay provided by the electronic delay circuit 5. The envelope signals for modulation which are to be applied to the carrier oscillator 4 will have waveforms as shown in FIGS. 6(5)*a*) or 6(5)*b*) depending on the position of changeover switch 11, wherein the waveforms are opposite each other in the direction of delay time modulation of the electronic delay circuit 5. Thus, the original music tone signal from the amplifier 6, which is unmodulated, and the modulated musical tone signal which has been time delay modulated in the electronic delay circuit 5 are mixed with each other in the amplifier 7, whereby at the output terminal 8 there will be obtained an output musical tone signal having a chorus effect characterized by a varying frequency during the build-up of the musical tone signal, such as, for example, those tone variations in the brass winds and string bass.

The third modification is shown in FIG. 5 in which the modulating signal generating means is constituted by a control signal generator 2 connected in series to an envelope forming circuit 9', and the modulation signal for the frequency of the carrier oscillator signal of the carrier oscillator 4 is the output envelope signal of the envelope forming circuit 9', said envelope forming circuit 9' being triggered by the output gate signal of the control signal generator 2, which detects the musical tone signal input to produce a gate signal. Three possible envelope signal wave forms from envelope forming circuit 9' are shown in FIGS. 6(6)a)–c) (the number of wave forms are not limited because the wave forms are freely formed).

Variable resistor 12 is provided to adjust the crest value of the envelope signal to control the depth of the frequency modulation of the carrier oscillator signal of the carrier oscillator 4, and thus the range of delay provided by the electronic delay circuit 5. Thus, in the amplifier 7 the original musical tone signal passing through the amplifier 6 without having been modulated and the modulated musical tone signal which has been time delay modulated in the above electronic delay circuit 5 are mixed, so that at the output terminal 8 there is obtained an output musical tone signal having a chorus effect with tone variations due to the frequency variation corresponding to any characterized envelope produced by envelope forming circuit 9'.

What is claimed is:

1. A device for producing a chorus effect in an electronic musical instrument, comprising an electronic delay circuit having an input terminal to which a musical tone signal is supplied and a clock terminal to which a carrier oscillator signal is supplied for producing a time delay in the musical tone signal according to the frequency of the carrier oscillator signal, a non-modulating amplifier means coupled in parallel with said electronic delay circuit, mixing amplifier means coupled to the outputs of said electronic delay circuit and said non-modulating amplifier means for mixing the outputs thereof, a carrier oscillator coupled to said clock terminal of said electronic delay circuit for generating a carrier oscillator signal and normally oscillating at a relatively high frequency, a modulation signal generating means coupled to said carrier oscillator and said electronic delay circuit for detecting the musical tone signal input to said electronic delay circuit and for frequency modulating the carrier oscillator signal generated by said carrier oscillator toward lower oscillator frequencies only when a musical tone signal input is detected, whereby the delay time of said electronic delay circuit is modulated only when a musical tone signal input exists and when no musical tone signal exists, the carrier oscillator signal is not subjected to frequency modulation, the noise in said electronic delay circuit is not time delay modulated and any jarring effect in the output thereof is substantially eliminated.

2. The device as claimed in claim 1 in which said carrier oscillator normally oscillates at a frequency of from 80 to 100 KHz.

3. The device as claimed in claim 1 in which said modulation signal generating means comprises a modulation signal generator and a control signal generator connected in series and said control signal generator being connected to the input of said electronic delay circuit for detecting the musical tone signal input to said electronic delay circuit and the modulation signal generator being coupled to said carrier oscillator for frequency modulating the carrier oscillator signal.

4. The device as claimed in claim 1 in which said modulation signal generating means comprises a modulation signal generator and a control signal generator connected in series, said control signal generator being connected to the input of said electronic delay circuit for detecting the musical tone signal input to said electronic delay circuit, and the modulation signal generator being coupled to said carrier oscillator for frequency moduiating the carrier oscillator signal, and an envelope follower connected in parallel with said control signal generator and said modulation signal generator for superposing the output signal thereof and the output signal of said modulation signal generator for producing, in the output from said mixing amplifier means, a tone variation in the initial frequency varying period of the musical tone signal.

5. The device as claimed in claim 1 in which said modulation signal generating means comprises an envelope follower and a selective phase inversion circuit connected in series with the envelope follower being connected to the input of said electronic delay circuit and said selective phase inversion circuit being coupled to said carrier oscillator for selecting the normal phase or inverted phase of said envelope follower and for producing, in the output from said mixing amplifier means, a varying frequency during the buildup of the musical tone signal.

6. The device as claimed in claim 1 in which said modulation signal generating means comprises a control signal generator and an envelope forming circuit connected in series with the control signal generator being connected to the input of said electronic delay circuit for detecting the musical tone signal input to said electronic delay circuit and said envelope forming circuit being coupled to said carrier oscillator, for producing an arbitrary signal for frequency modulating the carrier oscillator signal, whereby the output from said mixing amplifier is a musical tone signal having a chorus effect with tone variations.

* * * * *